United States Patent
Liu et al.

(10) Patent No.: US 9,564,395 B2
(45) Date of Patent: *Feb. 7, 2017

(54) BONDING PAD ARRANGMENT DESIGN FOR MULTI-DIE SEMICONDUCTOR PACKAGE STRUCTURE

(71) Applicant: MediaTek Inc., Hsin-Chu (TW)

(72) Inventors: Hsing-Chih Liu, Taichung (TW); Chia-Hao Yang, Zhubei (TW); Ying-Chih Chen, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/809,482

(22) Filed: Jul. 27, 2015

(65) Prior Publication Data

US 2015/0333039 A1    Nov. 19, 2015

Related U.S. Application Data

(63) Continuation of application No. 14/271,792, filed on May 7, 2014, now Pat. No. 9,129,962.

(51) Int. Cl.
*H01L 23/48* (2006.01)
*H01L 23/522* (2006.01)
(Continued)

(52) U.S. Cl.
CPC ..... *H01L 23/5221* (2013.01); *H01L 23/49575* (2013.01); *H01L 23/50* (2013.01); *H01L 23/528* (2013.01); *H01L 23/5381* (2013.01); *H01L 23/5386* (2013.01); *H01L 24/06* (2013.01); *H01L 24/09* (2013.01); *H01L 24/49* (2013.01); *H01L 24/85* (2013.01); *H01L 25/0655* (2013.01); *H01L 24/05* (2013.01); *H01L 24/45* (2013.01); *H01L 24/48* (2013.01); *H01L 24/73* (2013.01); *H01L 2224/04042* (2013.01); *H01L 2224/05553* (2013.01); *H01L 2224/05554* (2013.01); *H01L 2224/0603* (2013.01); *H01L 2224/0612* (2013.01); *H01L 2224/32225* (2013.01); *H01L 2224/45144* (2013.01);
(Continued)

(58) Field of Classification Search
CPC ........... H01L 23/5221; H01L 23/49575; H01L 23/50; H01L 23/528; H01L 23/5381; H01L 23/5386; H01L 24/06; H01L 24/09; H01L 24/49; H01L 24/85; H01L 25/0655
USPC ........................................ 257/784, 786, 776
See application file for complete search history.

(56) References Cited

U.S. PATENT DOCUMENTS 5,328,079 A * 7/1994 Mathew .................. H01L 24/48
228/180.5
7,812,436 B2    10/2010 Wark
(Continued)

*Primary Examiner* — Tu-Tu Ho
(74) *Attorney, Agent, or Firm* — McClure, Qualey & Rodack, LLP

(57) ABSTRACT

A semiconductor package structure includes a base. A first die is mounted on the base. The first die comprises a plurality of first pads with a first pad area arranged in a first tier. A plurality of second pads with a second pad area is arranged in a second tier. A second die is mounted on the base. The second die includes a plurality of third pads arranged in a third tier. A first bonding wire has two terminals respectively coupled to one of the first pads and one of the third pads. A second bonding wire has two terminals respectively coupled to one of the third pads and one of the second pads.

22 Claims, 4 Drawing Sheets

(51) Int. Cl.
*H01L 23/538* (2006.01)
*H01L 23/528* (2006.01)
*H01L 23/50* (2006.01)
*H01L 23/495* (2006.01)
*H01L 23/00* (2006.01)
*H01L 25/065* (2006.01)

(52) U.S. Cl.
CPC ............... *H01L 2224/45147* (2013.01); *H01L 2224/48095* (2013.01); *H01L 2224/48137* (2013.01); *H01L 2224/48138* (2013.01); *H01L 2224/48139* (2013.01); *H01L 2224/48227* (2013.01); *H01L 2224/48465* (2013.01); *H01L 2224/48479* (2013.01); *H01L 2224/4903* (2013.01); *H01L 2224/4909* (2013.01); *H01L 2224/4911* (2013.01); *H01L 2224/4912* (2013.01); *H01L 2224/4917* (2013.01); *H01L 2224/4945* (2013.01); *H01L 2224/49171* (2013.01); *H01L 2224/73265* (2013.01); *H01L 2224/85181* (2013.01); *H01L 2224/85186* (2013.01); *H01L 2224/85205* (2013.01); *H01L 2224/92247* (2013.01); *H01L 2924/00014* (2013.01)

(56) References Cited

U.S. PATENT DOCUMENTS

| | | | |
|---|---|---|---|
| 9,129,962 B1* | 9/2015 | Liu | H01L 23/5221 |
| 2008/0136011 A1* | 6/2008 | Shibata | H01L 23/13 |
| | | | 257/691 |
| 2009/0309205 A1* | 12/2009 | Takahashi | H01L 23/49575 |
| | | | 257/686 |
| 2012/0238056 A1* | 9/2012 | Numazaki | H01L 21/565 |
| | | | 438/107 |

* cited by examiner

BONDING PAD ARRANGMENT DESIGN FOR MULTI-DIE SEMICONDUCTOR PACKAGE STRUCTURE

CROSS REFERENCE TO RELATED APPLICATIONS

This application is a Continuation of pending U.S. patent application Ser. No. 14/271,792, filed on May 7, 2014, the entirety of which is incorporated by reference herein.

BACKGROUND OF THE INVENTION

Field of the Invention

The present invention relates to a semiconductor package structure, and in particular to a compact die-to-die wire bonding pad arrangement design for a multi-die semiconductor package structure.

Description of the Related Art

The multi-die semiconductor package is getting more and more popular because of demands for multiple functions. In order to lower the product cost, a compact package size and a small die size are necessary. A die-to-die wire bonding technology is available in package subcontractors. Also, the die-to-die wire bonding technology is applied to reduce the package size and the package cost. In order to reduce the cost, Cu wire is popular for use in die-to-die wire bonding technology. However, the conventional die-to-die wire bonding design requires a specific die pad or package area for wire bonding requirements.

Thus, a compact die-to-die wire bonding pad arrangement design for a semiconductor package structure is desirable.

BRIEF SUMMARY OF INVENTION

A semiconductor package structure is provided. An exemplary embodiment of a semiconductor package structure includes a base. A first die is mounted on the base. The first die comprises a plurality of first pads with a first pad area arranged in a first tier. A plurality of second pads with a second pad area is arranged in a second tier. A second die is mounted on the base. The second die comprises a plurality of third pads with the first pad area and a plurality of fourth pads with the second pad area alternately arranged in a third tier. A first bonding wire has two terminals respectively coupled to one of the first pads and one of the fourth pads. A second bonding wire has two terminals respectively coupled to one of the third pads and one of the second pads.

Another exemplary embodiment of a semiconductor package structure includes a base. A first die and a second die are mounted on the base. Each of the first and second dies comprises pads arranged in a first tier and a second tier, wherein the area of the pads arranged in the first tier is smaller than the area of the pads arranged in the second tier. A first bonding wire has two terminals respectively coupled to one of the pads in the first tier of the first die and one of the pads in the second tier of the second die. A second bonding wire has two terminals respectively coupled to one of the pads arranged in the second tier of the first die and one of the pads arranged in the first tier of the second die.

Yet another exemplary embodiment of a semiconductor package structure includes a base. A first die and a second die are mounted on the base. Each of the first and second dies comprises a plurality of first pads with a first pad area and a plurality of second pads with a second pad area arranged in a first tier. A conductive finger is disposed on the base, between the first and second dies. A first bonding wire has two terminals respectively coupled to one of the first pads of the first die and one of the second pads of the second die. A second bonding wire is divided into two segments, wherein the two segments are respectively coupled to another of the first pads of the first die and one of the first pads of the second die, and wherein the conductive finger is coupled to the two segments.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
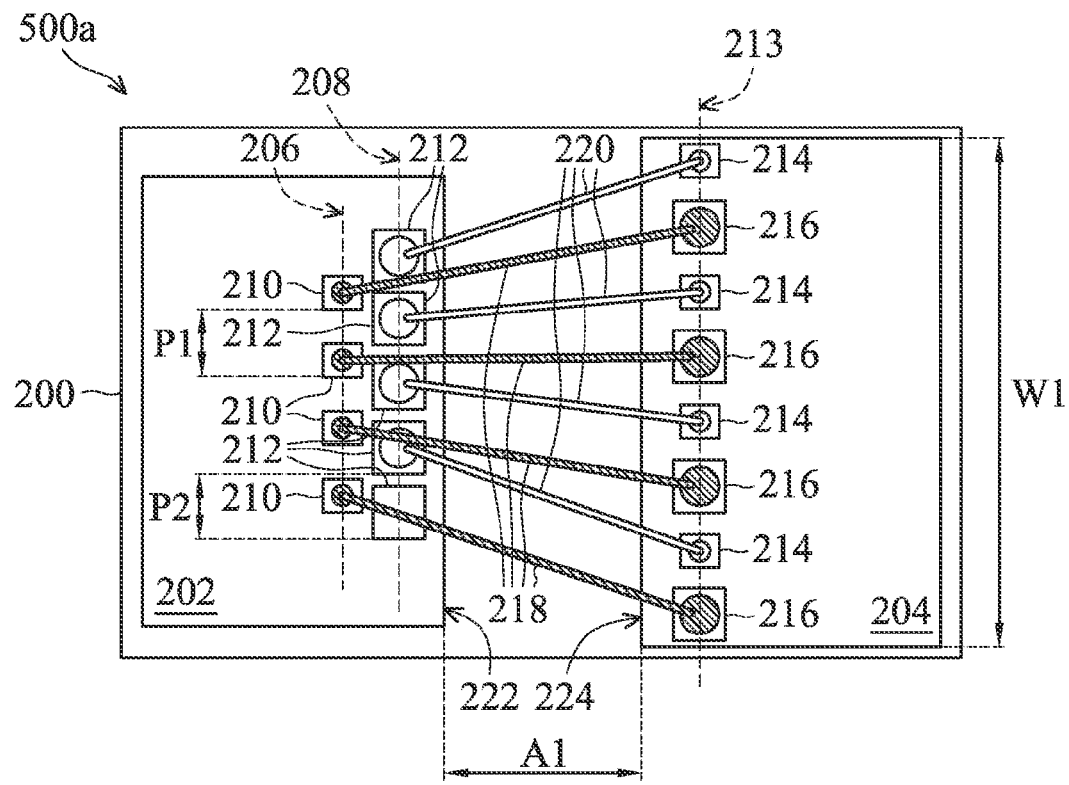
FIG. 1A is a top view showing one exemplary embodiment of a semiconductor package structure, explicitly showing one exemplary embodiment of a compact die-to-die wire bonding pad arrangement design for a semiconductor package structure.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 1B:
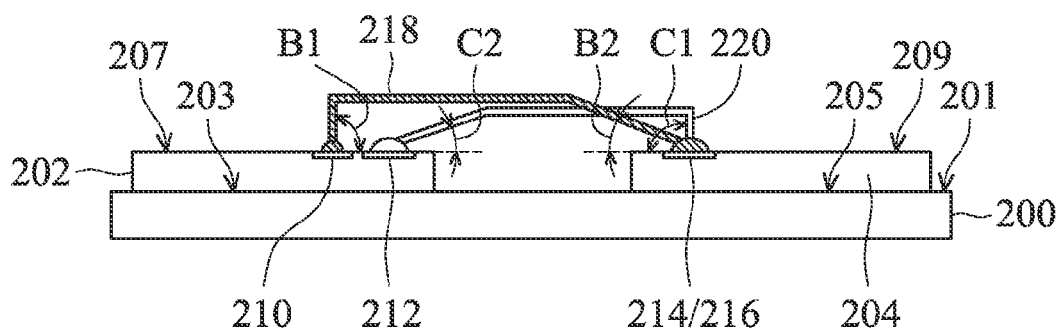
FIG. 1B is a side perspective view of one exemplary embodiment of a semiconductor package structure as shown in FIG. 1A.

FIG. 1A is a top view showing one exemplary embodiment of a semiconductor package structure 500a, explicitly showing one exemplary embodiment of a compact die-to-die wire bonding pad arrangement design for the semiconductor package structure 500a. FIG. 1B is a side perspective view of one exemplary embodiment of a semiconductor package structure 500a as shown in FIG. 1A. In one embodiment, the semiconductor package structure can be a flip-chip package using conductive structures connecting several semiconductor dies to a base. Also, the semiconductor package structure can be a package structure using wire bonding technology to connect several semiconductor dies to each other, or connect a semiconductor die to a base. Please refer to FIG. 1A, the semiconductor package structure 500a comprises a base 200 having a device attach surface 201. In one embodiment, the base 200, for example a print circuit board (PCB), may be formed of polypropylene (PP). It should be also noted that the base 200 can be a single layer or a multilayer structure. A plurality of conductive traces (not shown) may be embedded in the base 200. In one embodiment, the conductive traces may comprise signal trace segments or ground trace segments, which are used for input/output (I/O) connections of semiconductor dies mounted directly onto the base 200.

As shown in FIG. 1A and FIG. 1B, a first die 202 and a second die 204 are respectively mounted on the device attach surface 201 of the base 200 by a bonding process. In this embodiment, the first die 202 and the second die 204 are flip chip packages. In this embodiment, the first die 202 and the second die 204 are spaced apart from each other by a distance A1, which can be the same as or larger than the minimum spacing between dies of the design rule. In this embodiment, no fingers are designed between the first die 202 and the second die 204. Circuitries of the first die 202 and the second die 204 are interconnected to the circuitry of the base 200 via a plurality of conductive structures (not shown) disposed close to the bottom surface 203 of the first die 202 and the bottom surface 205 of the second die 204. In this embodiment, the first die 202 may comprise pads disposed on the top surface 207 thereof, and the second die 204 may comprise pads disposed on the top surface 209 thereof for die-to-die signal connection. Also, the pads disposed on the first die 202 and the second die 204 may have at least two pad area scales. In this embodiment, a plurality of first pads 210 with a first pad area and a plurality of second pads 212 with a second pad area are disposed on the top surface 207 of the first die 202. The first pads 210 are arranged in a first tier 206, and the second pads 212 are arranged in a second tier 208. In one embodiment, the first tier 206 and the second tier 208 of the first die 202 are parallel to each other and close to each other. In one embodiment, the first tier 206 and the second tier 208 of the first die 202 are parallel to an edge 222 of the first die 202, which is close to the second die 204, and the second tier 208 is closer to the edge 222 than the first tier 206. That is to say, no pad is disposed laterally between the pads (the second pads 212) in the second tier 208 and the edge 222 of the first die 202. In this embodiment, the first pad area of the first pads 210 is designed smaller than the second pad area of the second pads 212. That is to say, the second pads 212 with a large pad area are arranged closer to the edge 222 than the first pads 210 with a small pad area. In this embodiment, the first pads 210 are arranged in the first tier with a first pitch P1, and the second pads 212 are arranged in the second tier with a second pitch P2 larger than the first pitch P1.

Also, the pads with at least two pad area scales are disposed on the second die 204 in a single tier. In one embodiment as shown in FIGS. 1A and 1B, a plurality of third pads 214 with the first pad area and a plurality of fourth pads 216 with the second pad area larger than the first pad area are arranged in a third tier 213. In this embodiment, the third pads 214 and the fourth pads 216 are alternately arranged in a third tier 213. In this embodiment, the third pads 214 and the fourth pads 216 are arranged close to an edge 224 of the second die 204. That is to say, no pad is disposed laterally between the pads (the third pads 214 and the fourth pads 216) in the third tier 213 and the edge 224 of the second die 204.

Further, a die-to-die bonding wire is designed to couple a pad with a small pad area of one die and another pad with a large pad area of another die. In one embodiment, the pad with a small pad area may serve as a pad for a first bond, and the pad with a large pad area may serve as a pad for a second bond. During an Au or Cu wire bonding process, an Ag/Cu ball formed by melting the end of a bonding wire is brought into contact with one bond pad using pressure, heat, and ultrasonic forces to form the first bond ($1^{st}$ bond). The bonding wire is then run to the corresponding bond pad, forming a gradual arc or "loop" between the different bond pads. Pressure and ultrasonic forces are applied to the bonding wire to form the second bond ($2^{nd}$ bond) (known as a wedge bond, stitch bond, or fishtail bond). Normally for the Au or Cu wire bonding process, the pad open size and pad space with 2nd bond is designed to be much bigger than pad open with 1st bond. In this embodiment, as shown in FIGS. 1A and 1B, a first bonding wire 218 has two terminals designed to be respectively coupled to one of the first pads 210 with the first pad area on the first die 202 and one of the fourth pads 216 with the second pad area larger than the first pad area on the second die 204. In this embodiment, each of the first pads 210 with a small pad area may serve as a pad for a first bond, and each of the fourth pads 216 with a large pad area may serve as a pad for a second bond. Therefore, the first bonding wire 218 is bonded to one of the first pads 210 with a first angle B1, and the first bonding wire 218 is bonded to one of the fourth pads 216 with a second angle B2 less than the first angle B1. Also, a second bonding wire 220 has two terminals respectively coupled to one of the third pads 214 with the first pad area on the second die 204 and one of the second pads 212 with the second pad area larger than the first pad area on the first die 202. In this embodiment, each of the third pads 214 with a small pad area may serve as a pad for a first bond, and each of the second pads 212 with a large pad area may serve as a pad for a second bond. Therefore, the second bonding wire 220 is bonded to one of the third pads 214 with a first angle C1, and the second bonding wire 220 is bonded to one of the second pads 212 with a second angle C2 less than the first angle C1. In some embodiments, in order to avoid cross-over problem, the second bonding wires 220 are bonded prior to the bonding process of the first bonding wires 218.

One exemplary embodiment of the semiconductor package structure 500a provides a compact die-to-die wire bonding pad arrangement design with the following advantages. The pads disposed on the first die and the second die may have at least two pad area scales for the first bond and the second bond. For the first die (for example, the first die 202), the pads of the first die are arranged in two tiers, wherein the pads with a small pad area are arranged in a first tier and the pads with a large pad area are arranged in a second tier which is closer to an edge of the first die than the first tier. Therefore, the pads in the first tier may have a reduced pitch than the pads in the second tier. A space between adjacent pads and a pad occupied area in the first and second tiers of the first die can be reduced. Additionally, for the second die (for example, the second die 204), the pads with at least two pad area scales are disposed on the second die in a single tier. Compared with the conventional die with pads for the second bond only, a pad open area of the second die can be reduced. Accordingly, the chip cost can be reduced. Also, due to no finger being disposed between the first die and the second die, a die-to-die space could be reduced and have the substrate design easier as well as help reducing the package size (cost).

Figure 2A:
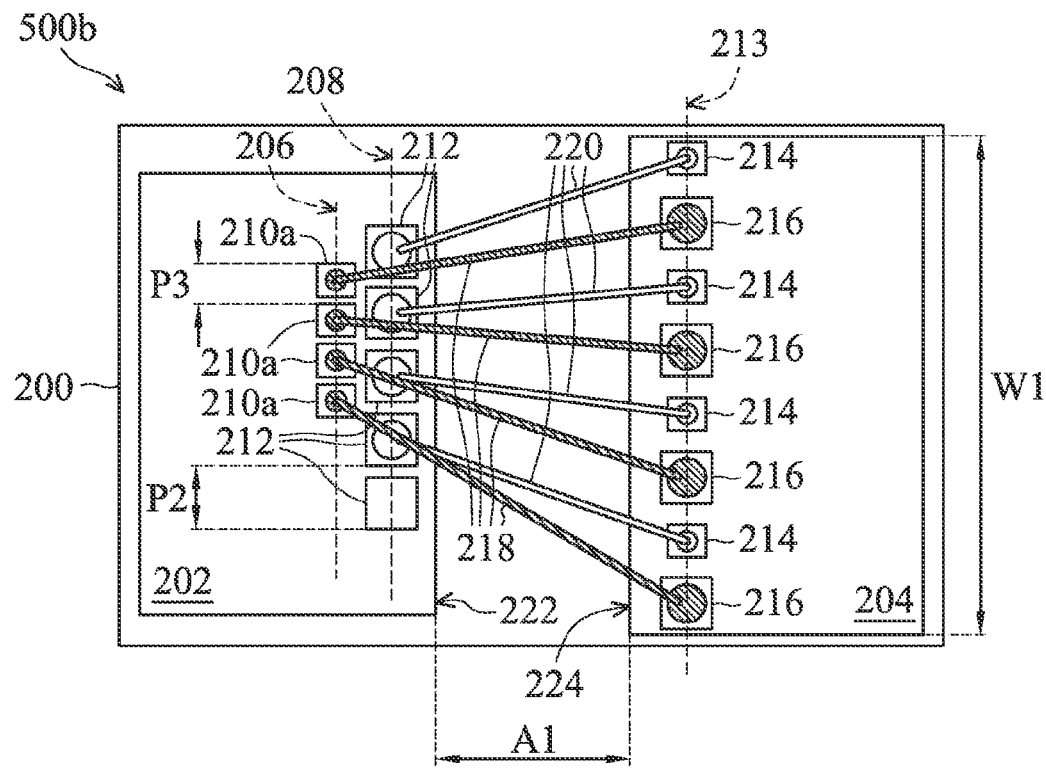
FIG. 2A is a top view showing another exemplary embodiment of a semiconductor package structure, explicitly showing another exemplary embodiment of a compact die-to-die wire bonding pad arrangement design for a semiconductor package structure.
Figure 2B:
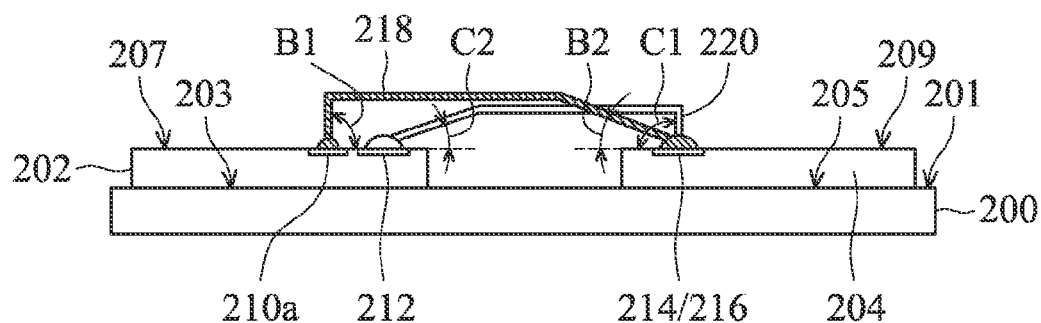
FIG. 2B is a side perspective view of another exemplary embodiment of a semiconductor package structure as shown in FIG. 2A.

Alternatively, the first pads with a first pad area arranged in a first tier of the first die may have a flexible pad pitch to reduce the die bond pad area. FIG. 2A is a top view showing another exemplary embodiment of a semiconductor package structure 500b, explicitly showing another exemplary embodiment of a compact die-to-die wire bonding pad arrangement design for the semiconductor package structure 500b. FIG. 2B is a side perspective view of another exemplary embodiment of a semiconductor package structure 500b as shown in FIG. 2A. Elements of the embodiments that are the same or similar to those previously described with reference to FIGS. 1A and 1B, are hereinafter not repeated. In this embodiment, the first die 202 and the second die 204 are spaced apart from each other by a distance A1, which can be the same as or larger than the minimum spacing between dies of the design rule. In this embodiment, no fingers are designed between the first die 202 and the second die 204. Also, the pads disposed on the first die 202 and the second die 204 may have at least two pad area scales. The pad arrangement of the second die 204 of the semiconductor package structure 500b is the same as the pad arrangement of the second die 204 of the semiconductor package structure 500a. One of the differences between the semiconductor package structure 500b as shown in FIGS. 2A and 2B and the semiconductor package structure 500a as shown in FIGS. 1A and 1B is that first pads 210a of the first die 202 of the semiconductor package structure 500b are arranged in the first tier 206 with a third pitch P3 smaller than the first pitch P1 of the first pads 210 of the semiconductor package structure 500a.

Besides the advantages of the semiconductor package structure 500a, the semiconductor package structure 500b has the advantage of a further reduced pad pitch of the first tier of the first die.

Figure 3A:
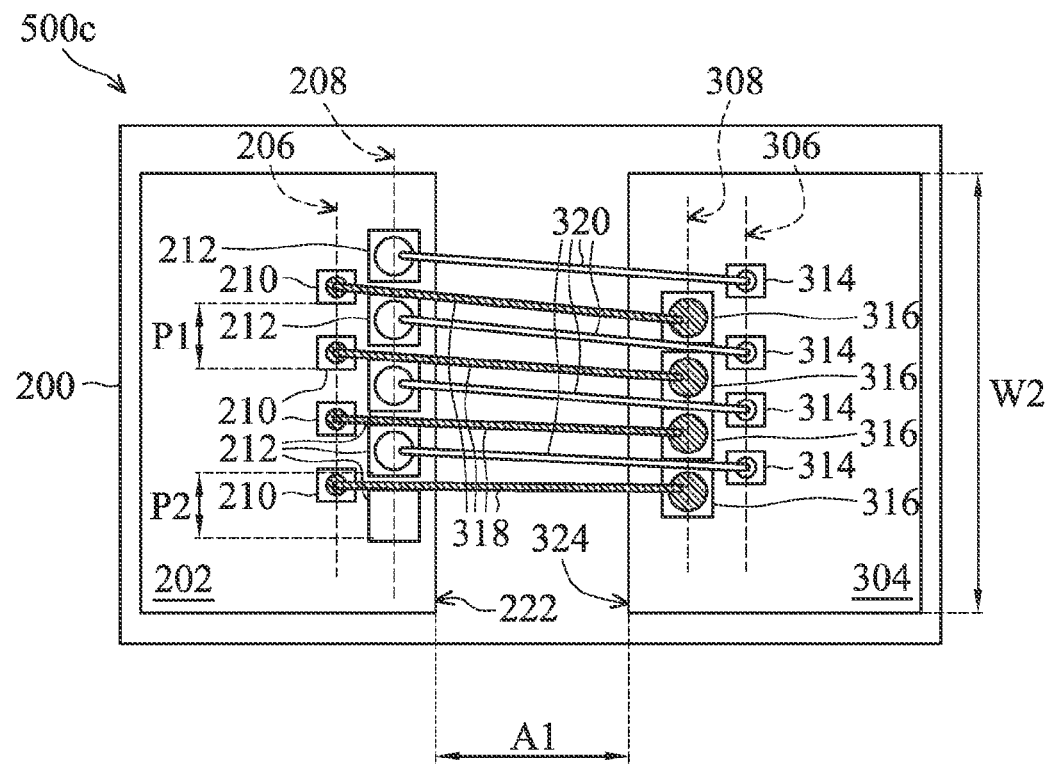
FIG. 3A is a top view showing yet another exemplary embodiment of a semiconductor package structure, explicitly showing yet another exemplary embodiment of a compact die-to-die wire bonding pad arrangement design for a semiconductor package structure.
Figure 3B:
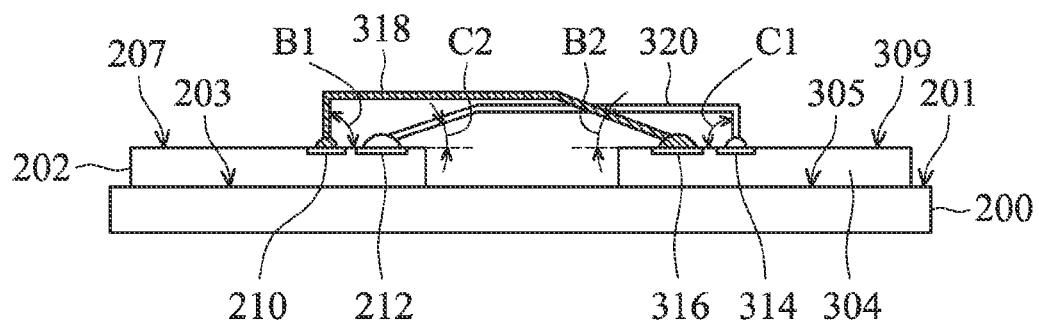
FIG. 3B is a side perspective view of yet another exemplary embodiment of a semiconductor package structure as shown in FIG. 3A.

Alternatively, the pads of the two dies for die-to-die wire bonding may be designed being arranged in multiple tiers to reduce die width. FIG. 3A is a top view showing yet another exemplary embodiment of a semiconductor package structure 500c, explicitly showing yet another exemplary embodiment of a compact die-to-die wire bonding pad arrangement design for the semiconductor package structure 500c. FIG. 3B is a side perspective view of yet another exemplary embodiment of a semiconductor package structure 500c as shown in FIG. 3A. Elements of the embodiments that are the same or similar to those previously described with reference to FIGS. 1A, 1B, 2A and 2B, are hereinafter not repeated for brevity. In this embodiment, the first die 202 and the second die 204 are spaced apart from each other by a distance A1, which can be the same as or larger than the minimum spacing between dies of the design rule. In this embodiment, no fingers are designed between the first die 202 and the second die 204. Also, the pads disposed on the first die 202 and the second die 204 may have at least two pad area scales. The pad arrangement of the first die 202 of the semiconductor package structure 500c is the same as the pad arrangement of the first die 202 of the semiconductor package structure 500a. One of the differences between the semiconductor package structure 500c as shown in FIGS. 3A and 3B and the semiconductor package structure 500a as shown in FIGS. 1A and 1B is that the first die 202 and the second die 304 of the semiconductor package structure 500c both comprise pads arranged in two tiers. In this embodiment, as shown in FIGS. 3A and 3B, a plurality of third pads 314 with a first pad area and a plurality of fourth pads 316 with a second pad area are disposed on the top surface 309 of the second die 304. The third pads 314 are arranged in a first tier 306, and the fourth pads 316 are arranged in a second tier 308. Therefore, a die width W2 of the second die 304 as shown in FIG. 3A may be designed with less than a die width W1 of the second die 204 as shown in FIG. 1A. In one embodiment, the first tier 306 and the second tier 308 of the second die 304 are parallel to each other and close to each other. In one embodiment, the first tier 306 and the second tier 308 of the second die 304 are parallel to an edge 324 of the second die 304, which is close to the first die 202, and the second tier 208 is closer to the edge 324 of the second die 304 than the first tier 306. That is to say, no pad is disposed laterally between the pads (the fourth pads 316) in the second tier 308 and the edge 324 of the second die 304. In this embodiment, the first pad area of the third pads 314 is designed to be smaller than the second pad area of the fourth pads 316. That is to say, the fourth pads 316 with a large pad area are arranged closer to the edge 324 than the third pads 314 with a small pad area.

Further, a die-to-die bonding wire is designed to couple a pad with a small pad area of one die and another pad with a large pad area of another die. In one embodiment, the pad with a small pad area may serve as a pad for a first bond, and the pad with a large pad area may serve as a pad for a second bond. In this embodiment as shown in FIGS. 3A and 3B, a first bonding wire 318 has two terminals designed to be respectively coupled to one of the first pads 210 with the first pad area in the first tier 206 on the first die 202 and one of the fourth pads 316 with the second pad area larger than the first pad area in the second tier 306 on the second die 304. Therefore, the first bonding wire 318 may cross over the second pad 212 of the first die 202 without connecting the second pad 212. In this embodiment, each of the first pads 210 with a small pad area may serve as a pad for a first bond, and each of the fourth pads 316 with a large pad area may serve as a pad for a second bond. Therefore, the first bonding wire 318 is bonded to one of the first pads 210 with a first angle B1, and the first bonding wire 318 is bonded to one of the fourth pads 316 with a second angle B2 less than the first angle B1. Also, a second bonding wire 320 has two terminals respectively coupled to one of the third pads 314 with the first pad area in the first tier 306 on the second die 304 and one of the second pads 212 with the second pad area larger than the first pad area in the second tier 208 on the first die 202. Therefore, the second bonding wire 320 may cross over the fourth pad 316 of the second die 304 without connecting the fourth pad 316. In this embodiment, each of the third pads 314 with a small pad area may serve as a pad for a first bond, and each of the second pads 212 with a large pad area may serve as a pad for a second bond. Therefore, the second bonding wire 320 is bonded to one of the third pads 314 with a first angle C1, and the second bonding wire 320 is bonded to one of the second pads 212 with a second angle C2 less than the first angle C1. In some embodiments, the first pads 210 of the first tier 206 need to have larger pitches to avoid the cross-over problem. So are the second pads 212 of the second tier 208, the third pads 314 of the first tier 306, and the fourth pads 316 of the second tier 308.

In this embodiment, a minimum pitch between the first bonding wire 318 and the adjacent second bonding wire 320 of the semiconductor package structure 500c can be reduced less than a minimum pitch between the first bonding wire 218 and the adjacent second bonding wire 220 of the semiconductor package structure 500a but should be kept based on a wire bonding rule.

The semiconductor package structure 500c provides a compact die-to-die wire bonding pad arrangement design with the following advantages. The pads disposed on the first die and the second die may have at least two pad area scales for the first bond and the second bond. The first die 202 and the second die 304 of the semiconductor package structure 500c both comprise pads arranged in two tiers. The pads with a small pad area (for the first bond) are arranged in a first tier and the pads with a large pad area (for the second bond) are arranged in a second tier which is closer to an edge of the first die than the first tier. Therefore, the pads in the first tier may have a reduced pitch than the pads in the second tier. Also, the pads arranged in multiple tiers may result in a reduced die width. The wire bonding for dies with pads with a multi-tier arrangement is allowable. Accordingly, the chip cost can be reduced. Also, due to no finger being disposed between the first die and the second die, a die-to-die space could be reduced and have the substrate be easier to design as well as help reduce the package size (cost).

Figure 4A:
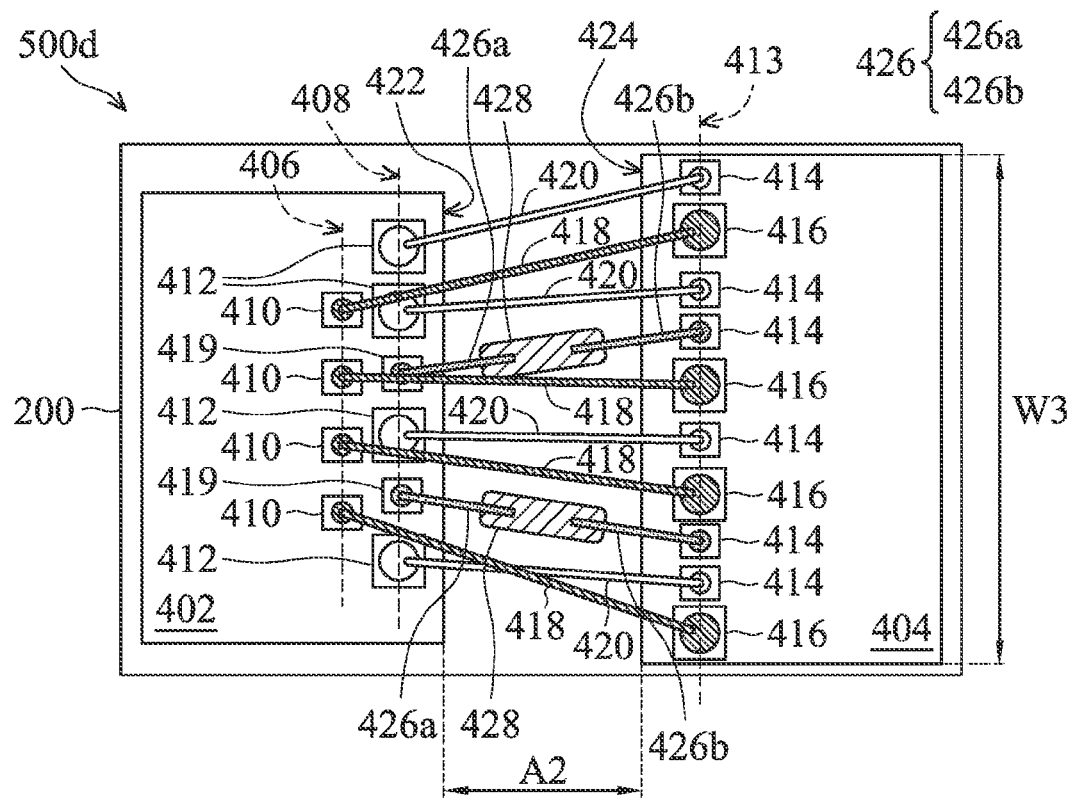
FIG. 4A is a top view showing still another exemplary embodiment of a semiconductor package structure, explicitly showing still another exemplary embodiment of a compact die-to-die wire bonding pad arrangement design for a semiconductor package structure.
Figure 4B:
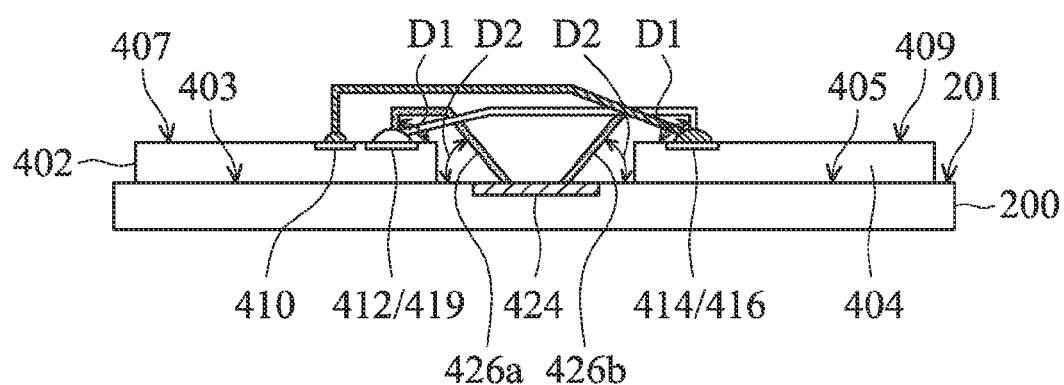
FIG. 4B is a side perspective view of still another exemplary embodiment of a semiconductor package structure as shown in FIG. 4A.

Alternatively, fingers may be added on the base for die-to-die connection to broaden design choices. FIG. 4A is a top view showing still another exemplary embodiment of a semiconductor package structure 500d, explicitly showing still another exemplary embodiment of a compact die-to-die wire bonding pad arrangement design for the semiconductor package structure 500d. FIG. 4B is a side perspective view of still another exemplary embodiment of a semiconductor package structure 500d as shown in FIG. 4A. Elements of the embodiments that are the same or similar to those previously described with reference to FIGS. 1A, 1B, 2A, 2B, 3A and 3B, are hereinafter not repeated. As shown in FIGS. 4A and 4B, at least one finger 428 may be designed to be disposed on the base 200, between a first die 402 and a second die 404. In this embodiment, the first die 402 and the second die 404 are spaced apart from each other by a distance A2, which is larger than the minimum spacing between dies of the design rule. For example, the distance A2 between the first die 402 and the second die 404 of the semiconductor package structure 500d as shown in FIG. 4A may be larger than or equal to the distance A1 between the first die 202 and the second die 204 of the semiconductor package structure 500a as shown in FIG. 1A.

In this embodiment as shown in FIGS. 4A and 4B, the first die 402 may comprise pads disposed on the top surface 407 thereof, and the second die 404 may comprise pads disposed on the top surface 409 thereof for die-to-die wire bonding. Also, the pads disposed on the first die 402 and the second die 404 may have at least two pad area scales. In this embodiment, a plurality of first pads 410 with a first pad area, a plurality of second pads 412 with a second pad area and a plurality of third pads 419 with a first pad area are disposed on the top surface 407 of the first die 402. As shown in FIG. 4A, the first pads 410 are arranged in a first tier 406. Also, the second pads 412 with the second pad area and the third pads 419 with the first pad area smaller than the second pad area are alternately arranged in a second tier 408. In one embodiment, the first tier 406 and the second tier 408 of the first die 402 are parallel to each other and close to each other. In one embodiment, the first tier 406 and the second tier 408 of the first die 402 are parallel to an edge 422 of the first die 402, which is close to the second die 404, and the second tier 408 is closer to the edge 422 than the first tier 406. That is to say, no pad is disposed laterally between the pads (the second pads 412 and the third pads 419) in the second tier 408 and the edge 422 of the first die 402.

Also, the pads with at least two pad area scales are disposed on the second die 404 in a single tier. Therefore, a die width W3 of the second die 404 as shown in FIG. 4A may be designed with less than the die width W1 of the second die 204 as shown in FIG. 1A. In this embodiment as shown in FIGS. 4A and 4B, a plurality of fourth pads 414 with the first pad area and a plurality of fifth pads 416 with the second pad area larger than the first pad area are arranged in a third tier 413. In this embodiment, the fourth pads 414 and the fifth pads 416 are arranged close to an edge 424 of the second die 404. That is to say, no pad is disposed laterally between the pads (the fourth pads 414 and the fifth pads 416) in the third tier 413 and the edge 424 of the second die 404.

Further, a die-to-die bonding wire is designed to couple a pad with a small pad area of one die and another pad with a large pad area of another die. In one embodiment, the pad with a small pad area may serve as a pad for a first bond, and the pad with a large pad area may serve as a pad for a second bond. In this embodiment as shown in FIGS. 4A and 4B, a first bonding wire 418 has two terminals designed to be respectively coupled to one of the first pads 410 with the first pad area on the first die 402 and one of the fifth pads 416 with the second pad area larger than the first pad area on the second die 404. In this embodiment, each of the first pads 410 with a small pad area may serve as a pad for a first bond, and each of the fifth pads 416 with a large pad area may serve as a pad for a second bond. Therefore, the first bonding wire 418 is bonded to one of the first pads 410 with a first angle B1, and the first bonding wire 418 is bonded to one of the fifth pads 416 with a second angle B2 less than the first angle B1.

Also, a second bonding wire 220 has two terminals respectively coupled to one of the fourth pads 414 with the first pad area on the second die 404 and one of the second pads 4212 with the second pad area larger than the first pad area on the first die 402. In this embodiment, some of the fourth pads 414 with a small pad area may serve as pads for a first bond, and each of the second pads 412 with a large pad area may serve as a pad for a second bond. Therefore, the second bonding wire 420 is bonded to one of the fourth pads 414 with a first angle C1, and the second bonding wire 420 is bonded to one of the second pads 412 with a second angle C2 less than the first angle C1.

In this embodiment as shown in FIGS. 4A and 4B, the semiconductor package structure 500d may further comprise another bonding wire to couple the first die 402 and the second die 404 by connecting to the conductive finger 428 disposed on the base 200 and between the first die 402 and the second die 404. Also, the bonding wire connecting to the conductive finger 428 may designed to couple a pad for the first bond of the first die 402 and another pad for the first bond of the second die 404. Further, the conductive finger 428 may serve as a finger for the second bond. As shown in FIGS. 4A and 4B, a third bonding wire 426 may be divided into two segments 426a and 426b. The two segments 426a and 426b are respectively coupled to one of the third pads 419 of the first die 402 and one of the fourth pads 414 of the second die 404. The die pad open area of the third pad 419 of the first die 402 is smaller than that of the second pad 412 of the second die 404. The die pad open area of the fourth pads 414 is also smaller than that of the fifth pad 416 of the second die 404. Therefore, the die pad open areas of the first die 402 and the second die 404 can be further reduced. Also, the conductive finger 428 is coupled to the two segments 426a and 426b.

The semiconductor package structure 500d also provides a compact die-to-die wire bonding pad arrangement design with the following advantages. The pads disposed on the first die and the second die may have at least two pad area scales for the first bond and the second bond. For the first die (for example, the first die 402), the pads of the first die are arranged in two tiers, wherein the pads with a small pad area are arranged in a first tier and the pads with small and large pad areas are arranged in a second tier which is closer to an edge of the first die than the first tier. Therefore, the pads in the first tier may have a reduced pitch than the pads in the second tier. The space between adjacent pads and a pad occupied area in the first and second tiers of the first die can be reduced. Additionally, for the second die (for example, the second die 404), the pads with at least two pad area scales are disposed on the second die in a single tier. Compared with the conventional die with pads for the second bond only, a pad open area of the second die can be reduced. Accordingly, the chip cost can be reduced. Also, due to no finger being disposed between the first die and the second die, a die-to-die space could be reduced and have the substrate be easier to design as well as help reduce the package size (cost).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a base;
   a first die mounted on the base, comprising:
   a plurality of first pads with a first pad area arranged in a first tier; and
   a plurality of second pads with a second pad area arranged in a second tier, wherein the first pad area is smaller than the second pad area; and
   a second die mounted on the base, comprising:
   a plurality of third pads, arranged in a third tier;
   a first bonding wire having two terminals respectively coupled to one of the first pads and one of the third pads; and
   a second bonding wire having two terminals respectively coupled to another one of the third pads and one of the second pads.

2. The semiconductor package as claimed in claim 1 wherein the first tier and the second tier of the first die are parallel to each other and close to each other.

3. The semiconductor package as claimed in claim 1, wherein the first tier and the second tier of the first die are parallel to an edge of the first die, which is close to the second die, and the second tier is closer to the edge than the first tier.

4. The semiconductor package as claimed in claim 1, wherein the first pads are arranged in the first tier with a first pitch, and the second pads are arranged in the second tier with a second pitch larger than the first pitch.

5. The semiconductor package as claimed in claim 1, wherein the first bonding wire is bonded to one of the first pads with a first angle, and the first bonding wire is bonded to one of the third pads with a second angle less than the first angle.

6. The semiconductor package as claimed in claim 1, wherein the second bonding wire is bonded to the another one of the third pads with a third angle, and the second bonding wire is bonded to one of the second pads with a fourth angle less than the third angle.

7. The semiconductor package as claimed in claim 1, further comprising:
   a conductive finger disposed on the base, between the first and second dies; and
   a third bonding wire divided into two segments, wherein the two segments are respectively coupled to another of the first pads and another of the third pads, and wherein the conductive finger is coupled to the two segments.

8. The semiconductor package as claimed in claim 1, wherein the first die comprises a fifth pad with the first pad area arranged in the second tier.

9. The semiconductor package as claimed in claim 8, further comprising:
   a conductive finger disposed on the base, between the first and second dies; and
   a third bonding wire divided into two segments, wherein the two segments are respectively coupled to the fifth pad and another of the third pads, and wherein the conductive finger is coupled to the two segments.

10. A semiconductor package structure, comprising:
    a base;
    a first die mounted on the base, comprising:
    a plurality of first pads arranged in a first tier; and
    a plurality of second pads arranged in a second tier; and
    a second die mounted on the base, comprising:
    a plurality of third pads and a plurality of fourth pads alternately arranged in a third tier, wherein the second tier is between the first tier and the third tier;
    a first bonding wire having two terminals respectively coupled to one of the first pads and one of the fourth pads; and
    a second bonding wire having two terminals respectively coupled to one of the third pads and one of the second pads,
    wherein the plurality of first pads has a first pad area, and the plurality of second pads has a second pad area, and wherein the first pad area is smaller than the second pad area.

11. The semiconductor package as claimed in claim 10 wherein the first tier and the second tier of the first die are parallel to each other and close to each other.

12. The semiconductor package as claimed in claim 10, wherein the first tier and the second tier of the first die are parallel to an edge of the first die, which is close to the second die, and the second tier is closer to the edge than the first tier.

13. The semiconductor package as claimed in claim 10, wherein the first pads are arranged in the first tier with a first pitch, and the second pads are arranged in the second tier with a second pitch larger than the first pitch.

14. The semiconductor package as claimed in claim 10, wherein the first bonding wire is bonded to one of the first pads with a first angle, and the first bonding wire is bonded to one of the fourth pads with a second angle less than the first angle.

15. The semiconductor package as claimed in claim 10, wherein the second bonding wire is bonded to one of the third pads with a third angle, and the second bonding wire is bonded to one of the second pads with a fourth angle less than the third angle.

16. The semiconductor package as claimed in claim 10, further comprising:
a conductive finger disposed on the base, between the first and second dies; and
a third bonding wire divided into two segments, wherein the two segments are respectively coupled to another of the first pads and another of the third pads, and wherein the conductive finger is coupled to the two segments.

17. A semiconductor package structure, comprising:
a base;
a first die mounted on the base, comprising:
a plurality of first pads arranged in a first tier; and
a plurality of second pads arranged in a second tier; and
a second die mounted on the base, comprising:
a plurality of third pads and a plurality of fourth pads alternately arranged in a third tier, wherein the second tier is between the first tier and the third tier;
a first bonding wire having two terminals respectively coupled to one of the first pads and one of the fourth pads; and
a second bonding wire having two terminals respectively coupled to one of the third pads and one of the second pads, wherein the plurality of first pads has a first pad area, and the second die comprises a fifth pad with the first pad area arranged in the second tier.

18. The semiconductor package as claimed in claim 17, further comprising:
a conductive finger disposed on the base, between the first and second dies; and
a third bonding wire divided into two segments, wherein the two segments are respectively coupled to the fifth pad and another of the third pads, and wherein the conductive finger is coupled to the two segments.

19. A semiconductor package structure, comprising:
a base;
a first die and a second die mounted on the base, each of the first and second dies comprising:
a plurality of first pads and a plurality of second pads, arranged in a first tier, wherein the first pads and the second pads on the first die have different pad sizes;
a conductive finger disposed on the base, between the first and second dies;
a first bonding wire having two terminals respectively coupled to one of the first pads of the first die and one of the second pads of the second die; and
a second bonding wire divided into two segments, wherein the two segments are respectively coupled to another of the first pads of the first die and one of the first pads of the second die, and wherein the conductive finger is coupled to the two segments.

20. The semiconductor package as claimed in claim 19, wherein the plurality of first pads has a first pad area, and the plurality of second pads has a second pad area, and wherein the first pad area is smaller than the second pad area.

21. The semiconductor package as claimed in claim 19, wherein the plurality of first pads has a first pad area, and the first die comprises a plurality of third pads with the first pad area arranged in a second tier, and wherein one of the third pads is coupled to another one of the second pads of the second die by a third bonding wire.

22. The semiconductor package as claimed in claim 21, wherein the first tier and the second tier of the first die are parallel to an edge of the first die, which is close to the second die, and the first tier is closer to the edge than the second tier.

* * * * *